(12) United States Patent
Matsubara et al.

(10) Patent No.: US 6,329,295 B1
(45) Date of Patent: Dec. 11, 2001

(54) SEMICONDUCTOR DEVICE CAPABLE OF HAVING AMORPHOUS CARBON FLUORIDE FILM OF LOW DIELECTRIC CONSTANT AS INTERLAYER INSULATION MATERIAL AND METHOD OF MANUFACTURING THE SAME

(75) Inventors: Yoshihisa Matsubara; Kazuhiko Endo, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/594,037

(22) Filed: Jun. 15, 2000

Related U.S. Application Data

(62) Division of application No. 09/052,937, filed on Apr. 1, 1998, now Pat. No. 6,104,092.

(30) Foreign Application Priority Data

Apr. 2, 1997 (JP) .................................................. 9-083773

(51) Int. Cl.⁷ ................................................. H01L 21/302
(52) U.S. Cl. ........................................... 438/710; 438/758
(58) Field of Search .................................. 438/710, 706, 438/719, 758, 759

(56) References Cited

U.S. PATENT DOCUMENTS 6,180,531 * 1/2001 Matsumoto et al. ................. 438/706

FOREIGN PATENT DOCUMENTS

| 8-83842 | 3/1996 | (JP) . |
| 8-222557 | 8/1996 | (JP) . |
| 8-236517 | 9/1996 | (JP) . |
| 8-264648 | 10/1996 | (JP) . |
| 8-321694 | 12/1996 | (JP) . |

OTHER PUBLICATIONS

H. Nishimura et al., "Reliable Submicron Vias Using Aluminum Alloy High Temperature Sputter Filling", 1991 VMIC Conference, IEEE, Jun. 11–12, 1991, pp. 170–176.

* cited by examiner

*Primary Examiner*—Roy Potter
(74) *Attorney, Agent, or Firm*—Sughrue, Mion, Zinn, Macpeak & Seas, PLLC

(57) ABSTRACT

A metal film with high melting point containing such nitrogen as titanium nitride is disposed on the interface between an amorphous carbon fluoride film and a metal. A structure is obtained from the function of a nitrogen-containing metal film with high melting point which prevents fluorine dispersion, to prevent such problems as the reaction of a metal and fluorine at heating process and the following falling or swelling of the metal film can be solved. In addition, the heating process possible to introduce in the manufacturing steps allow to complete the LSI making process of a practical multilayer wiring structure on the basis of a low dielectric constant of amorphous carbon.

8 Claims, 11 Drawing Sheets

SEMICONDUCTOR DEVICE CAPABLE OF HAVING AMORPHOUS CARBON FLUORIDE FILM OF LOW DIELECTRIC CONSTANT AS INTERLAYER INSULATION MATERIAL AND METHOD OF MANUFACTURING THE SAME

This is a divisional of Application Ser. No. 09/052,937 filed Apr. 1, 1998, now U.S. Pat. No. 6,104,092 the disclosure of which is incorporated herein by reference.

BACKGROUND OF THE INVENTION

The present invention relates to a semiconductor device having an insulation material consisting of an amorphous carbon fluoride film and a method of manufacturing the semiconductor device, and particularly to a semiconductor device having an interlayer insulation film consisting of an amorphous carbon fluoride film in a multilayer wiring structure and a method of manufacturing the semiconductor device.

As the result of the increased integration of large-scale integrated circuit (LSI) composed of semiconductors, individual elements with very small size of 0.25 μm or under are being integrated around the surface of a silicon substrate. An LSI works on the basis of wiring between individual elements. A wiring detour for avoiding crossing of wiring at a mutual connection between individual elements makes wiring areas in a chip area increase and signals due to increased wiring distance delay. For this reason, to avoid the crossing and piling up points of wiring, the insertion of an insulation film between wires is commonly applied for a multilayer wiring technique.

However, a multilayer wiring technique constructed by putting a thin insulation film therebetween has a problem of increasing a stray capacity between different wiring layers or between a wiring layer and a silicon substrate. The problem causes a signal delay in wiring and a cross talk on transmitting through two adjacent wires a signal containing a high frequency component pilling up in upper and down directions. A method to prevent the signal delay and cross talk is to decrease a stray capacity between wiring layers and to increase a distance between upper and lower wires, in other words, thicken an interlayer insulation film. However, this method deepens a contact hole and a via hole opened for connecting between a silicon substrate and a wiring layer or between the upper and lower wiring layers. Dry-etching technique due to forming of the deepened contact hole and via hole become more difficult to operate. Thus, the thickening of interlayer insulation film is not appropriate. For example, when the diameter of a contact hole should be 0.25 μm or less in such field as a semiconductor integrated circuit technology since manufacturing of 256 megabit DRAM (dynamic random access memory,) it is preferred on the point of dry-etching that the ratio called aspect ratio of the diameter of a contact hole to its maximum depth is 5 or less. Consequently, decreasing the stray capacity is required as well as decreasing the thickness of an interlayer insulation film to approximately 1 μm or less. In addition, there is another problem related to an increase in a stray capacity between wires extended on a same surface due to microscopic size as well as the problem occurring between upper and lower wiring layers. Decrease of a semiconductor integrated circuit to a microscopic size requires decrease in the thickness of wires as well as microscopic distance between wires and soon a distance between two wires will become equal to the thickness of the wire. Decrease in distance between wires gives a serious problem of a stray capacity between wires within a same wiring layer. In consideration of higher integration, increasing the distance between wires is impossible and signal delay in the same layer and cross talk are serious problems in contrast with the upper and lower wiring layers, there between an interlayer insulation film can be thickened.

In the present specification, a term of an interlayer insulation film is used for all insulation films including said insulation film between the upper and lower wiring layers, an insulation film between a wiring layer and a silicon substrate, and an insulation film between wires disposed in a same wiring layer.

On these technological backgrounds, a thin insulation film having a small relative dielectric constant $\epsilon r$ is being developed on the basis that an electrostatic capacity of a same structure proportionally changes to the relative dielectric constant of an insulating material put between electrodes, that signal delay proportionally changes to the square root of the relative dielectric constant of an insulation material, and that using a material of a lower dielectric constant for interlayer insulation film makes decrease in stray capacity between wires and in signal delay possible. For these reasons, replacing such insulation film as $Si_3N_4$ (relative dielectric constant $\epsilon r$ is 7) or $SiO_2$ (relative dielectric constant $\epsilon r$ is 3.9) well used for LSI technology, a material having a low relative dielectric of 3 or smaller constant allows to solve such problems as signal delay and cross talk avoiding problems such as difficulty to process an interlayer insulation film due to thickening.

For usages of materials with a low relative dielectric constant, a whole body of an interlayer insulation film is consisted of a low relative dielectric constant, or a low relative dielectric constant is used for a part of an interlayer insulation film. For example, making the interlayer insulation film is consisted of double layers its lower layer is consisted of a film of a material of a low relative dielectric constant and upper layer is consisted of conventionally used insulation material such as $SiO_2$. This method provides advantages such as that the problems of stray capacity and cross talk are solved by using a material having a low relative dielectric constant for a central part of serious problems of an interlayer capacity between wires distributed in a same layer and that using such material excellent for processing as $SiO_2$ for the upper layer makes flattening possible. The insulation film of the upper layer explained above is called flattened insulation film hereafter. The capacity between the upper and lower layers in such layered structure is the sum of the serial connection of capacities of the insulation film having a low dielectric constant and the capacity of flattened insulation film. It is possible to adjust an effective relative dielectric constant of a whole interlayer insulation film to a value desired.

An amorphous carbon fluoride film (a-C: F) is disclosed as a material with a low dielectric constant used for the aforesaid purpose in Japanese Unexamined Patent Publications such as 1996-83842, 1996-222557, and 1996-236517. The amorphous carbon fluoride film is recognized as excellent material with a low dielectric constant to solve the problems on the basis that a relative dielectric constant can be reduced approximately 2 according to manufacturing method thereof and fluorine content and that the material shows such good matching with LSI processing as yielding heat-resistant temperature of 400° C. or higher.

As stated before, although the amorphous carbon fluoride film has a low dielectric constant $\epsilon r$ and is evaluated as a material for interlayer insulation film, commercialization of the amorphous carbon fluoride film has not been realized. The reason is that the amorphous carbon fluoride film contains chemically active fluorine causing problems in technology of making a contact hole and via hole for use in connection of wiring metals, upper and lower layers. The problem is that on contacting an amorphous carbon fluoride film and a wiring metal, the reaction of fluorine contained in the amorphous carbon fluoride film and the metal is inevitably caused to occur in following heat processing step.

The reaction of fluorine contained in the amorphous carbon fluoride film to a metal caused problems stated below. Primarily, the relative dielectric constant of a film increases in accordance with a decrease in fluorine content ratio in the amorphous carbon fluoride film and as a result, a capacity between wires increases. In addition, a metal fluoride generated by the reaction to fluorine shows a higher resistance rather than that of a metal to increase in the resistance of wires. The increase in a capacity between wires and a resistance of a wire causes increase in signal delay. The reaction still causes another problem that the metal fluoride generated by the reaction to fluorine due to relatively low boiling point vaporizes in heat processing step to generate gas. For example, TiF4 generated in the heat processing under a temperature around 300° C. easily vaporizes, because TiF4 generated by the reaction of Ti to fluorine has the boiling point of 284° C. As a result, Ti is lost in the area, where fluorine dispersed, to increase in resistance of wires and resulted in the disturbance of circuit operation, generated bubbles cause swelling or falling portions in the structure formed on the adjacent areas or the upper part of those bubbles, and defects of semiconductor devices.

These problems are not restricted to the case of Ti that is a metal contacting to an amorphous carbon fluoride. The reaction to fluoride is also a problem when W, Al, copper (Cu), or an alloy containing these metals is used for a wire. In addition to said simple structure, the reaction occurs in any semiconductor device having a structure to allow the contact of a metal to an amorphous carbon fluoride. This means that said problem always causes a defect of a semiconductor device from heat processing against contacting parts of any metal with an amorphous carbon fluoride in any contact place and any structure of the semiconductor device. When heat processing is never carried out, after an amorphous carbon fluoride film was formed, a very difficult restriction occurs in the processing. Thus, a structure for preventing the aforesaid reaction is desired.

As a proposal for preventing a reaction of a metal with fluorine, a structure having a buffer layer of an insulation film, such as silicon oxide film or silicon nitride film inserted in the interface between a metal and an amorphous carbon fluoride film is disclosed in Japanese Unexamined Patent Publication 1996-264648. However, it is difficult for the structure made from such insulation film to protect a metal applied to the protection of the side wall of a contact hole or a via hole, because disposition of an insulation film in the inside wall of a hole decreases the sectional area of a buried wiring metal to raise resistance value thereof. Besides, when an insulation film is formed to protect the side wall of a hole, removal of an insulation film on the lower surface of a hole is required to connect upper and lower wiring layers. This requirement causes very difficult processing.

SUMMARY OF THE INVENTION

It is therefore an object of the present invention to provide a semiconductor device and a method of manufacturing the semiconductor device, in which the reaction of fluorine to a wiring metal for the use of amorphous carbon fluoride as an interlayer insulation film having a low dielectric constant can be prevented so as to solve such problems as increase in signal delay and destruction of a structure.

It is another object of the present invention to provide a semiconductor device having a practical structure on the basis of a characteristic of low dielectric constant of an amorphous carbon fluoride and a method of manufacturing the semiconductor device.

Other objects of the present invention will become clear as the description proceeds.

According to an aspect of the present invention, there is provided a semiconductor device which has an insulation material at least partly consisting of an amorphous carbon fluoride film, comprising: a film member including a nitrogen-containing metal film with high melting point at least partly on an interface between said amorphous carbon fluoride film and a metal material.

The metal material may include an alloy material.

The nitrogen-containing metal film with high melting point may have conductivity.

The nitrogen-containing metal film with high melting point may be a nitrogen-containing titanium film.

The nitrogen-containing titanium film may have a composition ratio approximately 1:1 of titanium and nitrogen.

The metal material may comprises a metal selected from aluminium, titanium, tungsten, copper, or silicon.

The metal material may alternatively comprise an alloy containing at least one metal selected from aluminium, titanium, tungsten, copper, or silicon.

The amorphous carbon fluoride film may be for use in at least a part of an interlayer insulation film in a multilayer wiring structure.

The film member including the nitrogen-containing metal film with high melting point may be formed at least on an interface between the amorphous carbon fluoride film and the metal material in a side wall of a via hole.

The via hole may alternatively be a contact hole.

According to another aspect of the present invention, there is provided a method of manufacturing a semiconductor device comprising the steps of: (A) forming an insulation film including at least an amorphous carbon fluoride film; (B) selectively etching said insulation film; (C) forming a conductive nitrogen-containing metal film with high melting point on said insulation film; (D) forming a film of wiring metal; and (E) heating at least said conductive nitrogen-containing metal film with high melting point.

The wiring metal may comprise a metal selected from aluminium, titanium, tungsten, copper, or silicon.

The wiring metal may alternatively comprise an alloy containing at least one metal selected from aluminium, titanium, tungsten, copper, or silicon.

The heating step may be carried out under temperature between 200° C. and 400° C., both inclusive.

The conductive nitrogen-containing metal film with high melting point may be a nitrogen-containing titanium film.

The nitrogen-containing titanium film may have a composition ratio approximately 1:1 of titanium and nitrogen.

DESCRIPTION OF THE PREFERRED EMBODIMENTS

Figure 1:
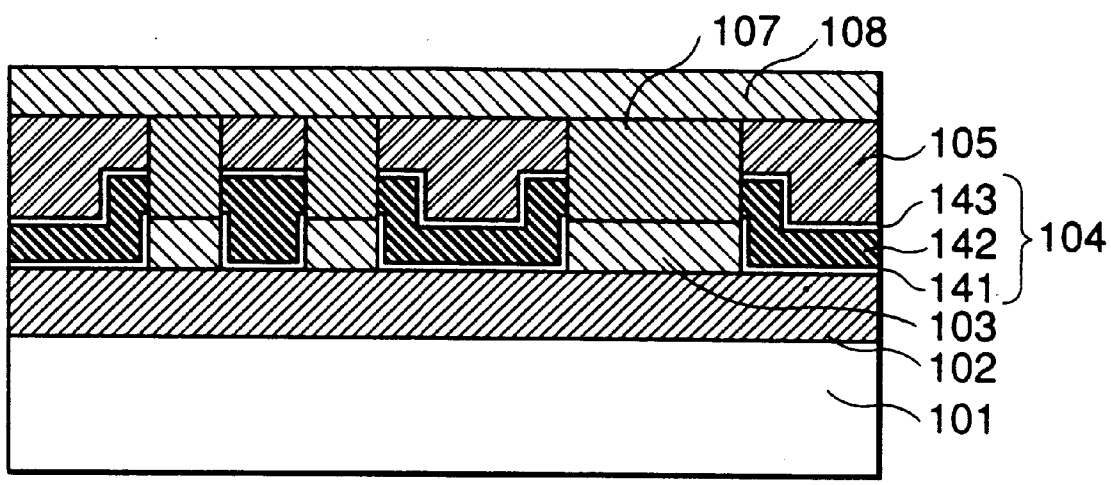
FIG. 1 is a schematic vertical sectional view of a conventional semiconductor device using an amorphous carbon fluoride film.
Figure 2:
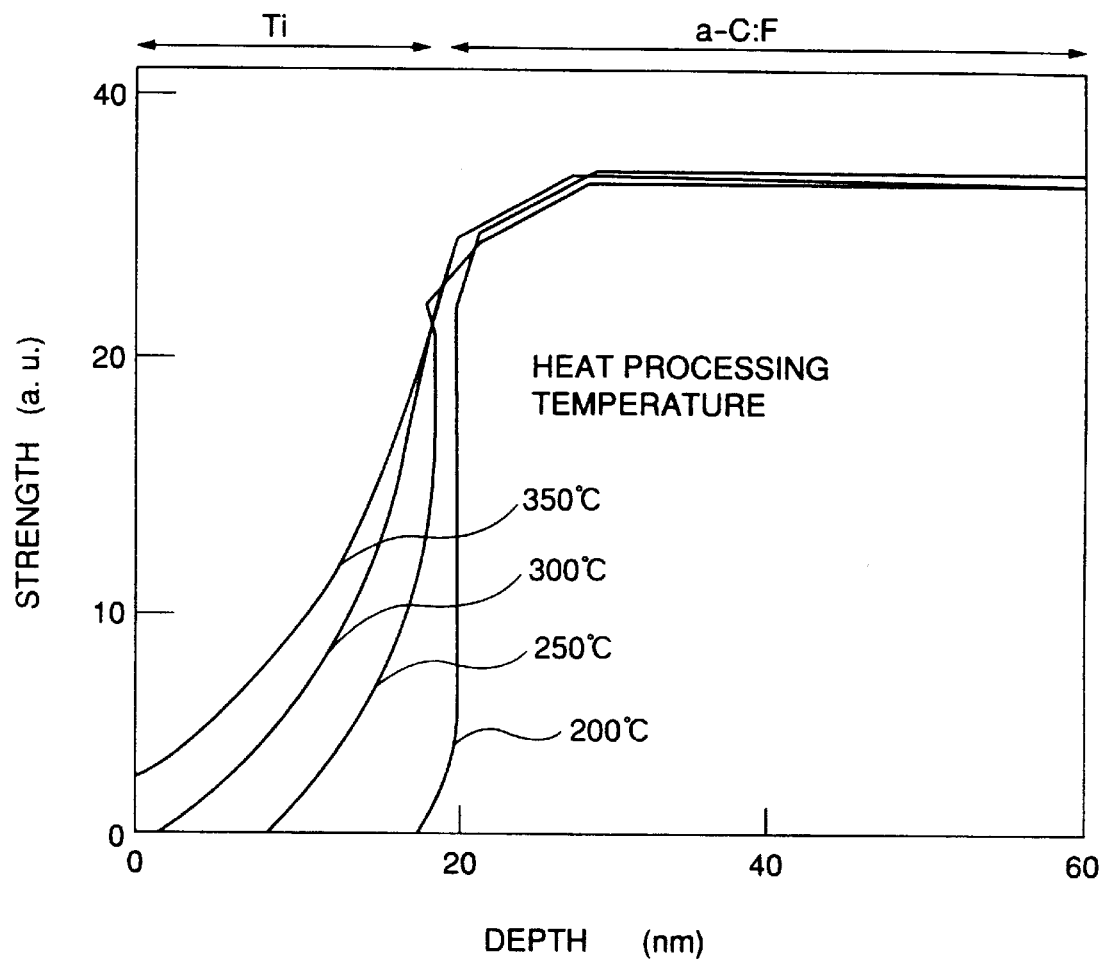
FIG. 2 is a graph for use in describing a fluorine distribution depending on heat processing around the interface between titanium and an amorphous carbon fluoride film in the conventional semiconductor device illustrated in FIG. 1.

Referring to FIGS. 1 and 2, description is, at first, made about a conventional semiconductor device for a better understanding of the present invention.

FIG. 1 shows a semiconductor device disclosed in Japanese Patent Application 1996-321694 (yet not published) as an example of the application of an amorphous carbon fluoride film to an interlayer insulation film put between wires in a multilayer structure. This example of the prior patent application presents a multilayer wiring semiconductor device having double layers constructed by an interlayer insulation film comprising an interlayer insulation film with a low dielectric constant consisting of an amorphous carbon fluoride film and a flattened insulation film.

As mentioned in the preamble of the instant specification, although the amorphous carbon fluoride film has a low dielectric constant εr and is evaluated as a material for interlayer insulation film, commercialization of the amorphous carbon fluoride film has not been realized. The reason is that the amorphous carbon fluoride film contains chemically active fluorine causing problems in technology of making a contact hole and via hole for use in connection of wiring metals, upper and lower layers. The problem is that on contacting an amorphous carbon fluoride film and a wiring metal, the reaction of fluorine contained in the amorphous carbon fluoride film and the metal is inevitably caused to occur in following heat processing step.

For example, FIG. 2 shows the dispersion of fluorine at heat processing step for a simple layered structure of an amorphous carbon fluoride film and titanium (Ti) film. The condition of the heat processing was under temperature between 200° C. and 350° C. for 30 minutes in vacuum and measurement of fluorine content around the interface between an amorphous carbon fluoride film and Ti after heat processing was carried out by using the X-ray photoelectron spectrophotometry (XPS). From the FIG. 2, it is known that the heat processing under temperature of 200° C. or higher resulted in the dispersion of fluorine contained in the amorphous carbon fluoride film into Ti, and Ti reacted with fluorine.

The reaction of fluorine contained in the amorphous carbon fluoride film to a metal caused problems stated below. Primarily, the relative dielectric constant of a film increases in accordance with a decrease in fluorine content ratio in the amorphous carbon fluoride film and as a result, a capacity between wires increases. In addition, a metal fluoride generated by the reaction to fluorine shows a higher resistance rather than that of a metal to increase in the resistance of wires. The increase in a capacity between wires and a resistance of a wire causes increase in signal delay. The reaction still causes another problem that the metal fluoride generated by the reaction to fluorine due to relatively low boiling point vaporizes in heat processing step to generate gas. For example, TiF4 generated in the heat processing under a temperature around 300° C. easily vaporizes, because TiF4 generated by the reaction of Ti to fluorine has the boiling point of 284° C. As a result, Ti is lost in the area, where fluorine dispersed, to increase in resistance of wires and resulted in the disturbance of circuit operation, generated bubbles cause swelling or falling portions in the structure formed on the adjacent areas or the upper part of those bubbles, and defects of semiconductor devices.

These problems are not restricted to the case of Ti that is a metal contacting to an amorphous carbon fluoride. The reaction to fluoride is also a problem when W, Al, copper (Cu), or an alloy containing these metals is used for a wire. In addition to said simple structure, the reaction occurs in any semiconductor device having a structure to allow the contact of a metal to an amorphous carbon fluoride. For example, the multilayer wiring structure of the prior patent application presented in FIG. 1 suggests a possibility to improve contact of a wiring metal with an amorphous carbon fluoride film in the side wall of a via hole. This means that said problem always causes a defect of a semiconductor device from heat processing against contacting parts of any metal with an amorphous carbon fluoride in any contact place and any structure of the semiconductor device. When heat processing is never carried out, after an amorphous carbon fluoride film was formed, a very difficult restriction occurs in the processing. Thus, a structure for preventing the aforesaid reaction is desired.

As a proposal for preventing a reaction of a metal with fluorine, a structure having a buffer layer of such insulation film as silicon oxide film or silicon nitride film to insert in the interface between a metal and an amorphous carbon fluoride film is disclosed in Japanese Unexamined Patent Publication 1996-264648. Also in an example of the prior patent application of the FIG. 1 aforementioned, upper and lower contact layers 141 and 143 putting an amorphous carbon fluoride film 142 between them are consisted of silicon-excess oxidized film (SiO) and diamond-like carbon (DLC), respectively, improve contact performance of an amorphous carbon fluoride film 142 with surrounding structures, and protect against the reaction of fluorine to the side wall of the first wiring layer 103 consisting of Al, Si and Cu.

However, it is difficult that the structure made from such insulation film to protect a metal applied to the protection of the side wall of a contact hole or a via hole, because disposition of an insulation film in the inside wall of a hole decreases the sectional area of a buried wiring metal to raise resistance value thereof. Besides, when an insulation film is formed to protect the side wall of a hole, removal of an insulation film on the lower surface of a hole is required to connect upper and lower wiring layers. This requirement causes very difficult, processing, as mentioned in the preamble of the instant specification.

Next, description is made about principle and function of the present invention before description of the preferred embodiments thereof.

The inventors of the present invention has found that formation of a metal film which contains nitrogen and has a high melting point, on the interface between an amorphous carbon fluoride film and a metal, is effective to prevent the dispersion of fluorine from an amorphous carbon fluoride film to a metal in heat processing and the reaction of fluorine. For this purpose, titanium, tantalum and tungsten can be used as a metal with high melting point; particularly, titanium gives the highest effect. Also, the inventors of the present invention has found that a content ratio of titanium and nitrogen is approximately 1:1, that is the common TiN film, is most effective as a film to prevent fluorine dispersion.

The effect of the nitrogen-containing metal film with high melting point to prevent the dispersion, in other words effect to prevent fluorine dispersion into a metal and the reaction of fluorine is based on the following reasons. A metal atom very tightly binds to nitrogen atom in such metal nitride with high melting point as titanium nitride to show a very stable nature to heat and chemical attack. The reaction of metal nitride with high melting point to fluorine requires cutting metal-nitrogen bond; therefore, such reaction merely occurs. As a result, fluorine dispersion into a metal nitride with high melting point does not occur. When a thin film, stable to heat and chemical attack, of metal nitride with high melting point is put on the interface between a film containing fluorine such as an amorphous carbon fluoride film and a metal, fluorine dispersion to a metal and the reaction of fluorine can be prevented by that the reaction and dispersion of fluorine are prevented in a metal nitride with high melting point. Besides, the stoichiometric composition ratio of the metal with high melting point and nitrogen become most stable in metal nitride with high melting point. Therefore, it can be said that in titanium containing nitrogen, the stoichiometric composition ratio, 1:1, shows the highest effect to prevent fluorine dispersion. This is same in other metals with high melting point; nitrogen-containing tungsten and nitrogen-containing tantalum also show the highest effect to prevent fluorine dispersion in WN and TaN with each stoichiometric composition ratio.

The nitrogen-containing metal film with high melting point shows such effect. When the film has conductivity, distinct effect yields in the structure of a semiconductor device and a manufacturing method thereof. Conventionally, it is known that the effect of silicon insulation materials, e.g., silicon oxide film and silicon nitride film, prevents fluorine dispersion; those materials was used for protection of a wiring layer shown in the prior art illustrated in FIG. 1. However, because any conductive material having a protecting effect to fluorine dispersion is not known, the protection of a side wall of a metal to be buried in a via hole and a contact hole was difficult. In the case of the application of a conductive nitrogen-containing metal film with high melting point such as titanium nitride, that is disclosed in the present invention, to the protection of the side wall of these holes, no problem occurs for electric connection between the upper and lower layers, even if a conductive film exists the lower surface of the hole. By this reason, its forming process needs forming of a conductive nitrogen-containing metal film with high melting point on a whole surface, before burying a wiring metal in the hole. Thus, following processing steps can be carried out together with that of wiring metal material. This means that protecting effect against fluorine dispersion is realized without a considerable increase in the number of processing steps. When such conductive material is used, the problem of resistance increase is small in forming a protecting film inside a hole in comparison with the use of insulation material.

In a semiconductor device in that an amorphous carbon fluoride film is used as an insulation film, it is possible to prevent the reaction of a metal to fluorine by putting either conventionally known silicon insulation film and nitrogen-containing metal film with high melting point disclosed in the present invention on the interface between these films, in the place of contact of an amorphous carbon fluoride film with a metal material. At this time, a silicon insulation film and a conductive nitrogen-containing metal film with high melting point are put on a place favorable of being an insulation film for structure or processing and a place favorable of being a conductive film, respectively.

Furthermore, the application of a structure for inserting nitrogen-containing metal film with high melting point in the interface between a wiring metal or alloy and an amorphous carbon fluoride film allows to take a heating process as a step after the formation of an amorphous carbon fluoride film to yield more practical LSI manufacturing process. This means that an annealing step can be applied for improving device quality and a film-forming step with heating a substrate under 200° C. or higher temperature is also applied to improve greatly the freedom of processing; both these steps could not be applied in the past.

When the structure and manufacturing method of the invention stated above is used, decrease in fluorine content in an amorphous carbon fluoride film, the formation of fluoride in a metal, and increase in resistance and swelling or falling of a film in accordance with the formation can be all prevented as a result of prevented dispersion and reaction of fluorine at heating treatment in the use of an amorphous carbon fluoride film. Thus, the manufacturing of a semiconductor device of high integration giving high reliability and high productivity becomes possible on the basis of the feature of an amorphous carbon fluoride film showing a low dielectric constant.

Figure 3:
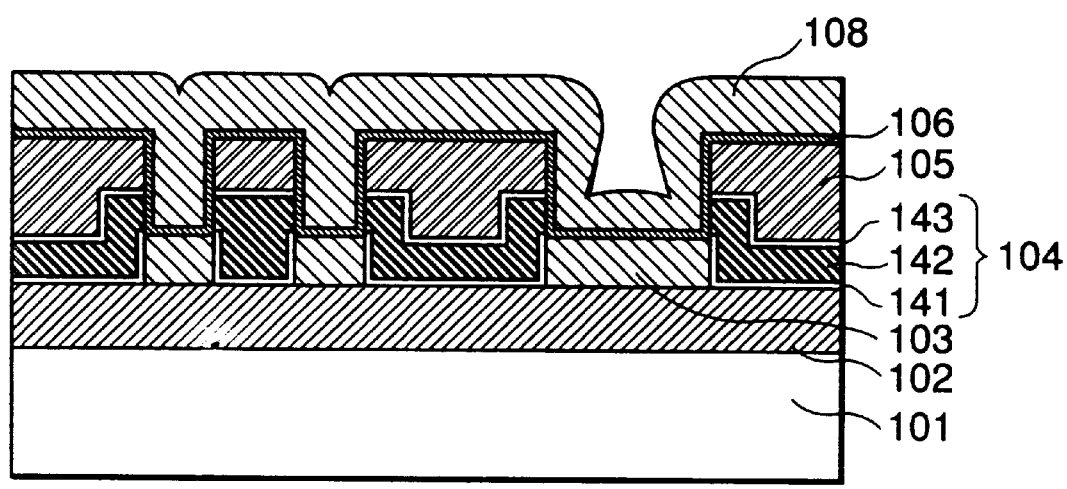
FIG. 3 is a schematic vertical sectional view of a semiconductor device according to a first embodiment of the present invention.
Figure 4A:
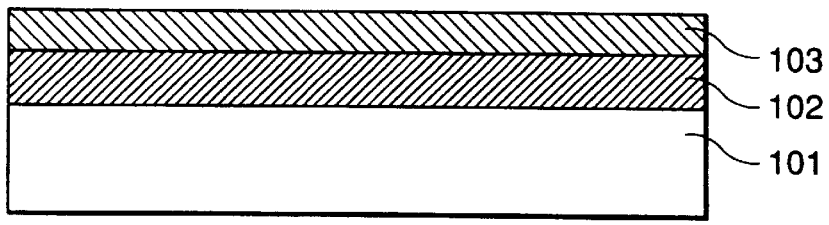
FIGS. 4A to 4I, drawn on three sheets, are schematic vertical sectional views of the semiconductor device at various steps of a method according to a first embodiment of the present invention.
Figure 4B:
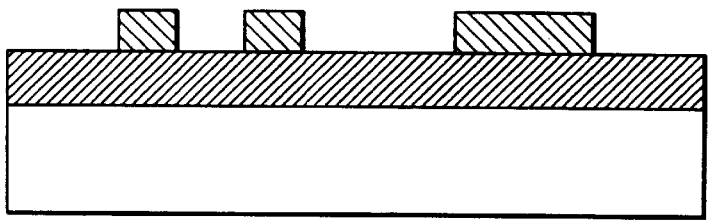
Figure 4C:
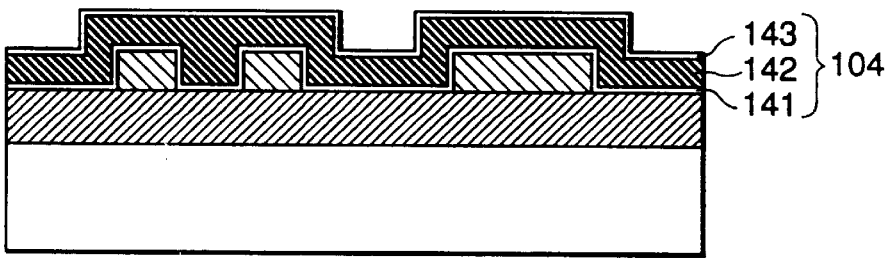
Figure 4D:
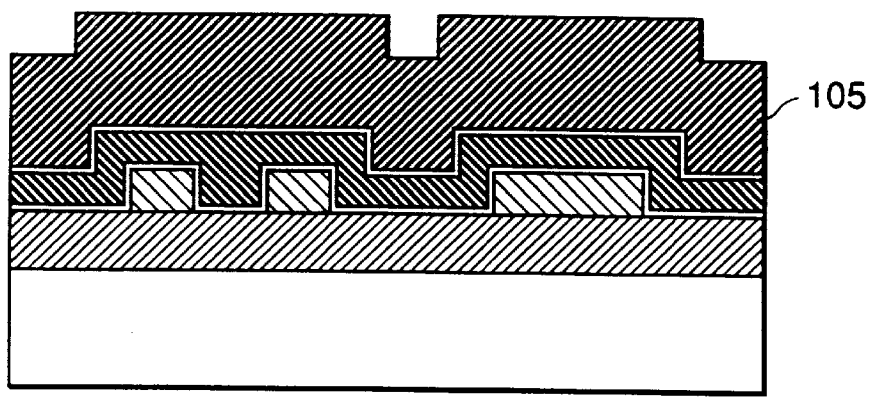
Figure 4E:
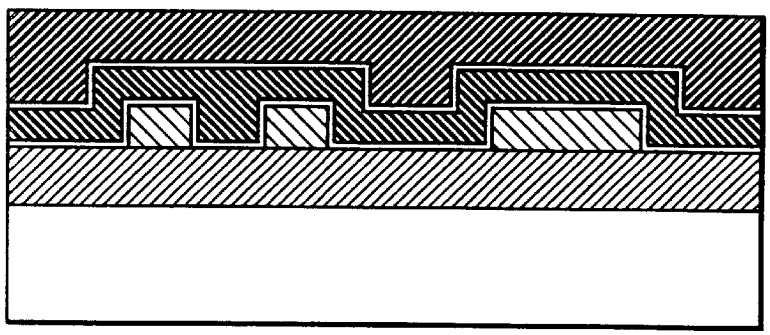
Figure 4F:
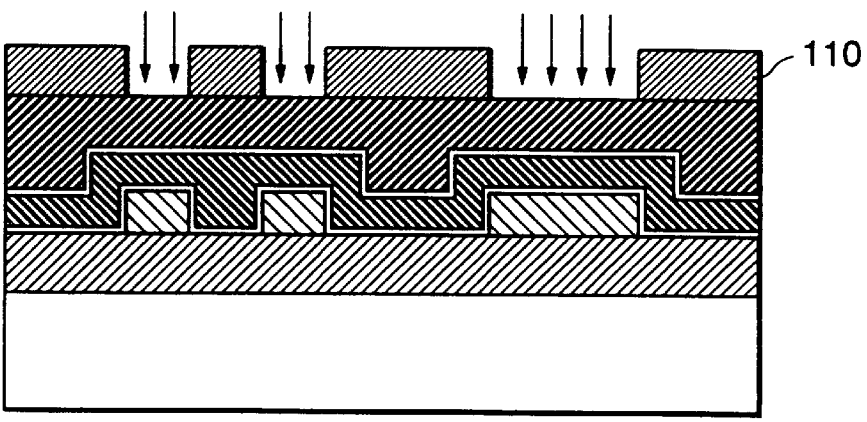
Figure 4G:
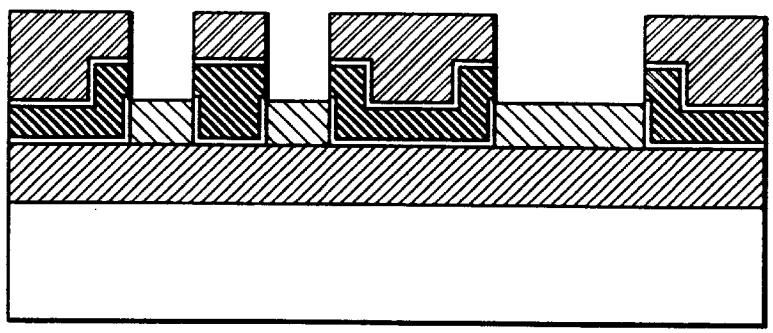
Figure 4H:
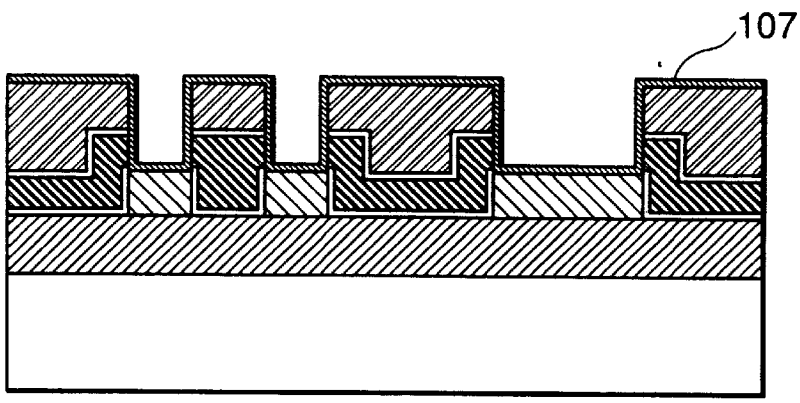
Figure 4I:
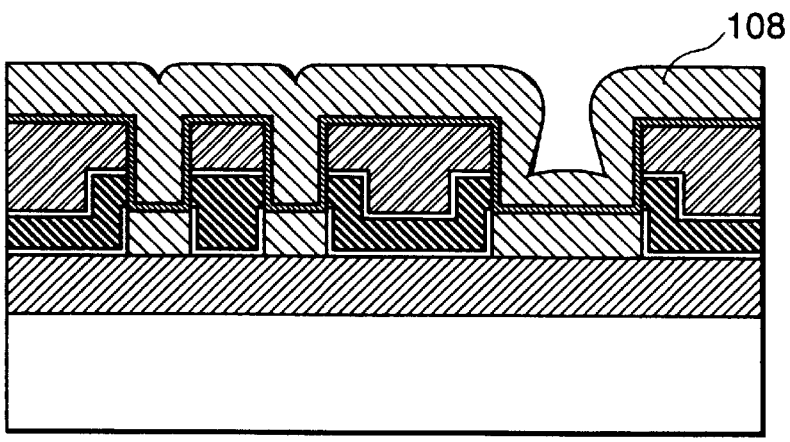
Figure 5:
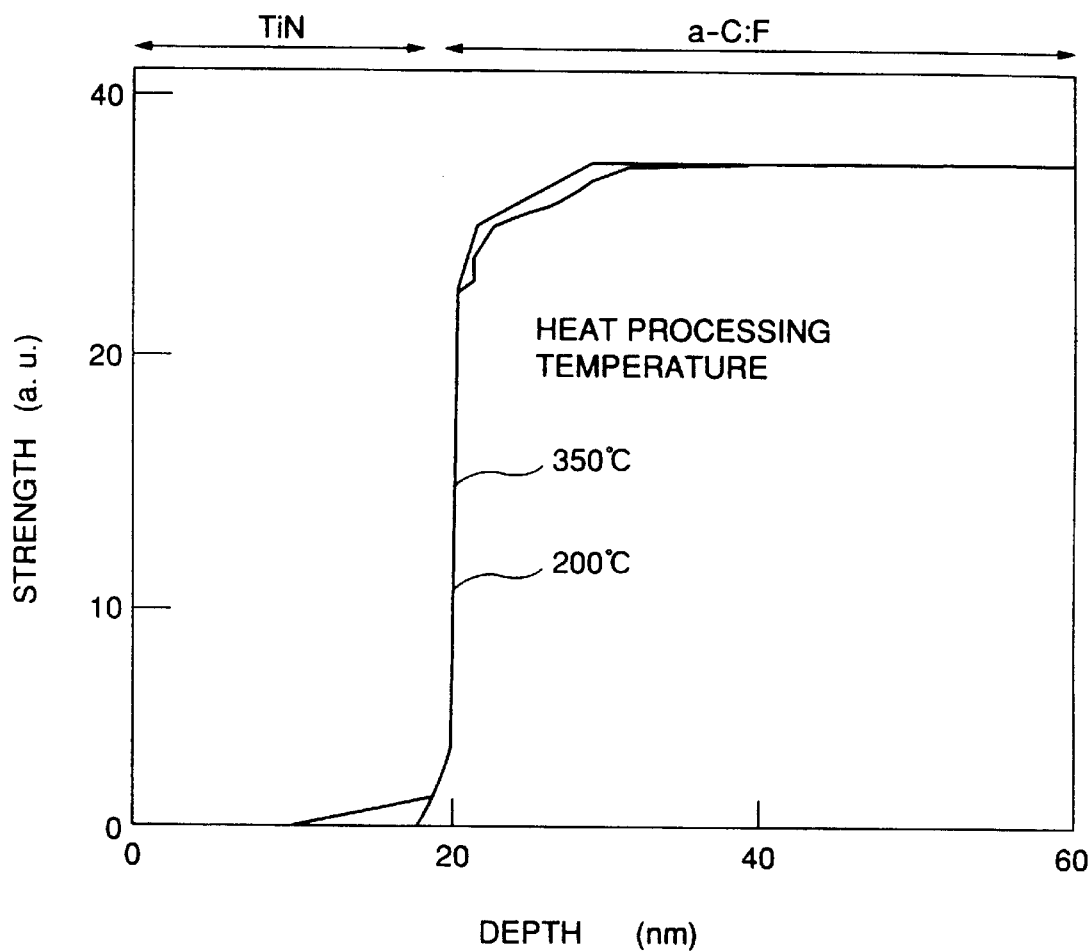
FIG. 5 is a graph for use in describing a fluorine distribution depending on heat processing around the interface between titanium and an amorphous carbon fluoride film in the semiconductor device illustrated in FIG. 3.

Now, referring to FIGS. 3 to 5, description will proceed to a semiconductor device and a method of manufacturing the semiconductor device according to a first embodiment of the present invention.

FIGS. 3 and 4 are used for the explanation of a semiconductor device having the multilayer wiring of double layers. It can be naturally said that the following techniques can be frequently applied for multilayer wiring. FIG. 3 shows the structure of the final sectional area of the example and FIGS. from 4A to 4I show forming sequences of the structure as shown in the FIG. 3.

The structure of the final sectional area of the FIG. 3 is first described. A first wiring layer 103 is put on an insulation film 102 formed on a silicon substrate 101 in which device area such as a dispersion layer has been formed but not illustrated. An amorphous carbon fluoride film 142 sandwiched with a upper contact layer 141 and a lower contact layer 143 is put on the first wiring layer 103; an interlayer insulation film 104 with a low dielectric constant is composed of these layers. These contact layers 141 and 143 are insulation films having a double layers structure composed of a silicon-excessive film and a DLC film; the DLC films are located in both sides of the amorphous carbon fluoride film 142. The upper of the interlayer insulation film 104 with a low dielectric constant has a flattened insulation film 105; these two films work as the interlayer insulation film. The whole surface of the upper and the opening of the flattened film 105 has a nitrogen-containing metal film with high melting point being the main component of the invention. A second wiring layer 108 is put on the upper of the component to connect electrically to the first wiring layer 103 in the lower surface of a via hole.

Next, description is made as regards a method of manufacturing the structure presented in the FIG. 3 by using the sectional view of processing steps from FIGS. 4A to 4I.

The following are steps of FIG. 4A. The multilayer wiring structure in the semiconductor device is formed on the insulation film 102 formed on the silicon substrate 101, on which a dispersing layer and another layer being device forming areas have been previously formed (not illustrated), by normal CVD method and other methods. On the insulation film 102, a connecting hole (contact hole; not illustrated) to such semiconductor device area as the dispersion layer formed on the silicon substrate 101 is first formed by normal method. Next, TiN layer with a thickness from some nanometers to some ten nanometers, Al—Si—Cu layer of 600 nm, and finally TiN with a thickness from some nanometers to some ten nanometers are all formed on a whole surface by the sputtering method as the first wiring layer 103 of the lowermost layer (FIG. 4A shows whole the TiN/Al—Si—Cu/TiN structure). Finally, a resist mask for selective etching is formed by normal lithography and the resist mask is processed by normal dry-etching to make the wiring of the lowermost first wiring layer 103 by patterning as shown in the FIG. 4B Next, after removing the resist mask, the interlayer insulation film 104 with a low dielectric constant is formed with a structure composed of the contact layer 141, the amorphous carbon fluoride film 142, and the contact layer 143 (FIG. 4C) the whole of the interlayer insulation film 104 with the low dielectric constant has a multilayer structure composed of the silicon-excessive film, the DLC, the amorphous carbon fluoride film 142, DLC, and the silicon-excessive film in the order from the lower layer, because the contact layers 141 and 143 correspond to the DLC/silicon-excessive film of the double layer structure as stated before. In this example, all these layers were formed by plasma CVD.

As the silicon-excessive film, an oxide film (SiO2) with the composition ratio, 1:1, of silicon to oxygen was formed by adjusting silane (SiH4) and oxygen supplies to use as a material of the plasma CVD. Next, by giving a relevant hydrogen concentration to films a strong and contact film can be formed in the formation of DLC film. In this example, CH4 was used for the material of DLC film formation and hydrogen concentration in a film was adjusted by applying a biased voltage to a substrate at a film formed by the plasma CVD. Next, an amorphous carbon fluoride film is formed by using CF4 and CH4 as materials. Subsequently, the formation of DLC film and silicon-excessive film is repeated finally to form an interlayer insulation film with a low dielectric constant consisting of the contact layer 141 (silicon-excessive film/DLC), the amorphous carbon fluoride film 142, and the contact layer 143 (DLC/silicon-excessive film) (FIG. 4C) The contact layers 141 and 143 comprise the silicon-excess film and DLC protect against corrosion of Al of the first wiring layer by fluorine and improve a contact degree between the upper and lower layers and the first wiring layer. For these purposes, the thickness of the silicon-excessive film and DLC film requires 5 nm or more. In this example, the thickness of the silicon-excessive film and DLC film was 50 nm each and the thickness of the upper and lower contact layers 141 and 143 was 100 nm each. The thickness of the amorphous carbon fluoride film 142 was 600 nm.

In the present example, CF4 and CH4 were used for a gas material to make the amorphous carbon fluoride film 142. Other substances such gases containing fluorine as CF4, C2F6, C3F8, C4F8 and CHF3 can be used for the material. In addition, these gases allow to be used by mixing hydrogen (H2,) hydrocarbon such as CH4, C2H6C3H8, C2H4, C2H2 or other gases for the material gas. As disclosed in Japanese Unexamined Patent Publication 1996-236517, improving of heat resistant property by adding nitrogen or silicon to an amorphous carbon fluoride film 142 does not decrease the effect of the invention.

The flattened insulation film 105 is formed following the formation of the interlayer insulation film 104 with a low dielectric constant. In the present example, the flattened insulation film 105 is formed from SiO2 with the thickness of approximately 2 $\mu$m by a plasma CVD (FIG. 4D) Following the thick flattened insulation film 105 yielded, a rough surface with the height of the first wiring layer 103 remaining on the surface is flattened by CMP. For flattening by CMP, a normal alkaline slurry is used and the flattened insulation film 105 is ground up 800 nm for perfect flattening (FIG. 4E)

Next step is to perforate a via hole. First, a resist mask 110 is formed for via hole perforation in the normal resist step. Following this step, SiO2 film of the flattened insulation film 105 is selectively etched taking care of breaking through the film by the normal dry etching by using such a gas as CF4. Further following this step, the interlayer insulation film 104 having a low dielectric constant and including the amorphous carbon fluoride film 142 is selectively etched by an etching method using oxygen gas (FIG. 4F) Next, the resist mask 110 is removed by incineration treatment in a normal oxygen plasma to open a via hole.

Following the perfect formation of the via hole, the main part of the invention of this application, i.e., a nitrogen-containing metal film with high melting point 106, is formed. In this example, titanium nitride is formed as a nitrogen-containing metal film 106 on the entire surface with high melting point by the sputtering method (FIG. 4H). The temperature and thickness of a substrate of a film formed was 200° C. and 100 nm, respectively. However, the thickness of films of a flattened part and the side wall of a hole are very different in film formation by the sputtering method: the thickness of films in the present example was 100 nm and approximately 10 nm in the flattened part and the via hole, respectively.

The formation of titanium nitride can be naturally formed by other method than the spattering method. Particularly, film forming methods exemplified by heat CVD method and plasma CVD method have an advantage in the point that conformal film formation is possible to yield a film having small differences of thickness among positions stated before.

Finally, a buried second wiring layer 108 is formed. In the present example, a double wiring layers structure is constructed by that Al—Si—Cu layer as the second wiring layer 108 was formed on whole surface by setting substrate temperature to 200° C. (FIG. 4I and by using the heat CVD method.

According to such steps, the double wiring structure was realized having the amorphous carbon fluoride film 142 sandwiched by the interlayer insulation film 104 with a low dielectric constant and the nitrogen-containing metal film 106 with high melting point as film preventing fluorine dispersion. Further multiplication of film layers can be carried by repeating the sequence of steps described in FIG. 4B and later.

Fluorine dispersion protection effect of the nitrogen-containing metal film 106 with high melting point was examined by heat processing of the structure of the present example completed by aforesaid processes as shown in the FIG. 3. Heat processing was carried out under a temperature between 200° C. and 350° C. for 30 minutes in vacuum and later, resulted fluorine dispersion and structural change were studied. FIG. 5 shows a result of measurement of fluorine composition of the interface between the amorphous carbon fluoride film 142 and the adjacent areas of the nitrogen-containing metal film 106 with high melting point and consisting of titanium oxide by XPS, following heat treatment on the structure of the present example shown in FIG. 3.

As shown in FIG. 5, it can be known that fluorine dispersion and reaction were prevented on the basis of the observation that fluorine dispersion was not recognized in the structure of the invention having the nitrogen-containing metal film 106 with high melting point consisting of titanium nitride. Swelling and falling were never observed in the structure of a section before and after heating process by using a scanning electron microscope and any difference in structure before and after heating process was not observed. From these examinations, it was confirmed that the structure of the invention having a nitrogen-containing metal film with high melting point and shown in the FIG. 3 prevents the reaction of a metal and fluorine in the heating process. However, in consideration of heat resistance of wiring material, the temperature in the heating step should be favorably kept to 400° C. or lower in using an aluminium alloy for wiring.

It is also found in the heat processing that the contact condition of TiN and amorphous carbon fluoride films is good on the basis of that no falling was found in the interface between these two films. In other words, TiN film gives the following secondary effect to yield improvement of contact performance as well as the preventing effect against fluorine dispersion.

Next, protecting effect against fluorine dispersion was examined by using the experiment described before with a change of film thickness of titanium nitride used for nitrogen-containing metal film with high melting point in the structure of the FIG. 3. As a result, satisfactory protecting effect against the dispersion yielded by aforesaid condition of the heat processing of titanium nitride film with a thickness of 5 nm or thicker. The lower limit of the necessary thickness of the film changes by heat processing condition. However, it is generally obvious that the enough thickness of the film is required, when processing temperature raises higher and the processing time prolongs longer. The upper limit of film thickness is not restricted. However, in consideration of burying performance into microscopically formed via holes and contact holes and the processing performance of the second wiring layer after the burying, a film is favorably thinned up approximately 50 nm in the maximum as possible.

A further similar experiment was conducted by changing the wiring material used for the second wiring layer 108 from Al—Si—Cu alloy to Al, W, Ti, and polycrystal silicon. In the experiment, no observation of fluorine dispersion into a wired metal was yielded and no problem of swelling occurred as well as in the case of Al—Si—Cu alloy. From these results, it was found that the dispersion protecting effect of fluorine by the structure of the invention does not depend on the kind of a metal used for the wiring material.

In the structure of the FIG. 3, when the material used for nitrogen-containing metal film with the high melting point 106 was changed from titanium nitride to nitrogen-containing tungsten and nitrogen-containing tantalum, the same effective result was obtained in the protection of fluorine dispersion.

Figure 6:
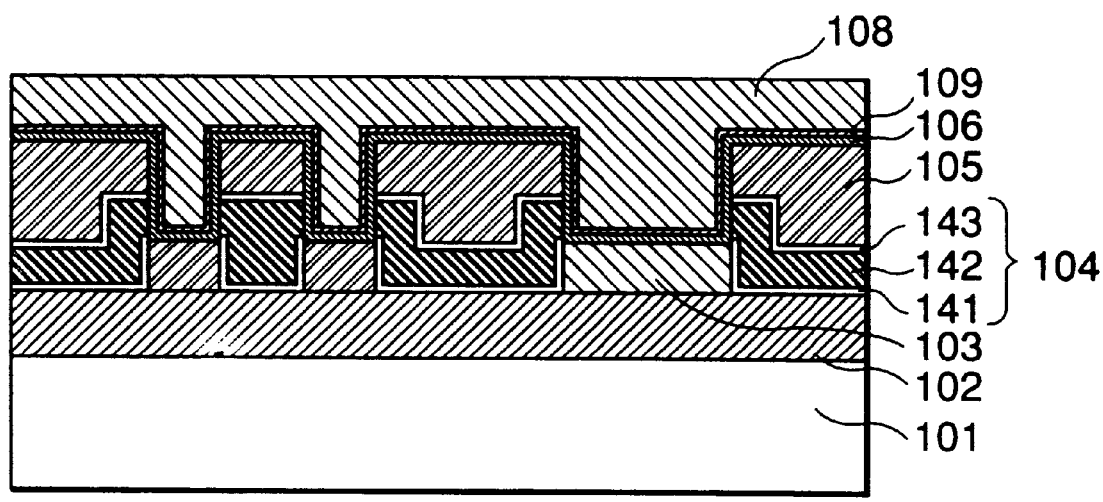
FIG. 6 is a schematic vertical sectional view of a semiconductor device according to a second embodiment of the present invention.
Figure 7A:
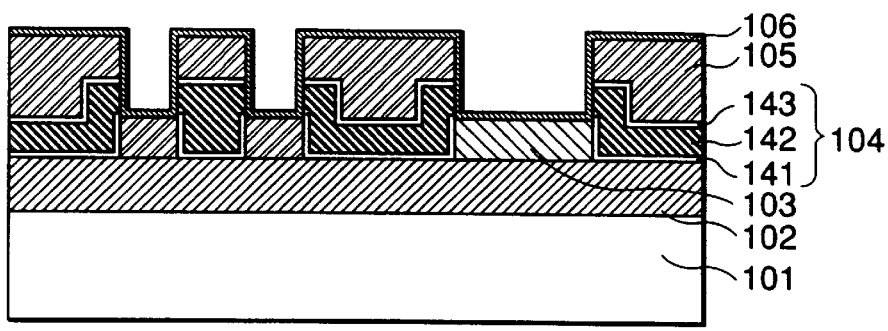
FIGS. 7A to 7C, drawn on one sheet, are schematic vertical sectional views of the semiconductor device at various steps of a method according to a second embodiment of the present invention.
Figure 7B:
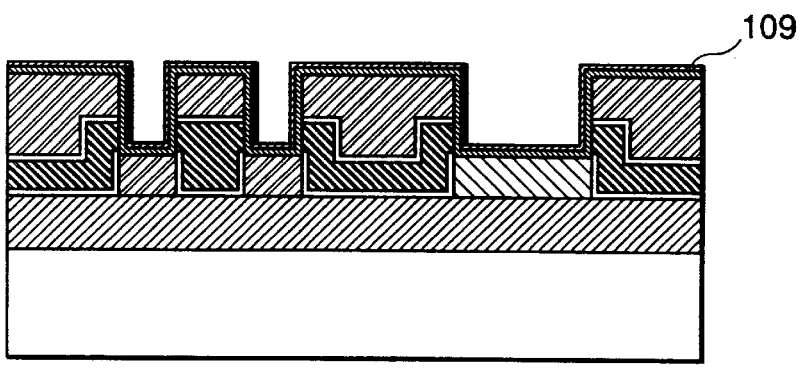
Figure 7C:
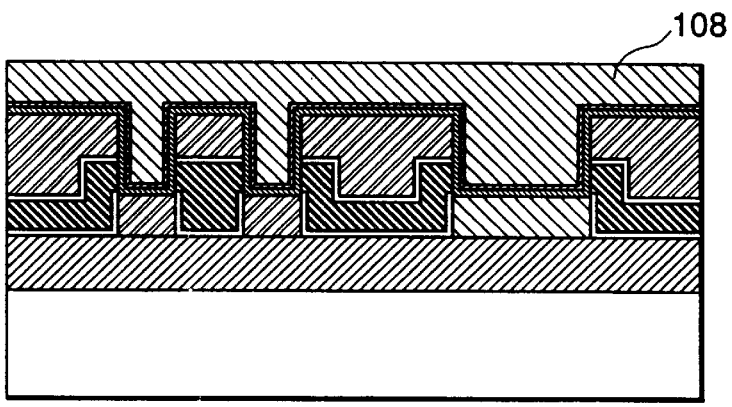

Referring to FIGS. 6 and 7, description proceeds to a semiconductor device and a method of manufacturing the semiconductor device according to a second embodiment of the present invention.

FIG. 6 shows a sectional structure of the semiconductor device after completion. The example is characterized by that a titanium film 109 has been sandwiched between the nitrogen-containing metal film 106, to prevent fluorine dispersion, with high melting point (TiN) and the second wiring layer 108. As already known, it becomes easy that the presence of the titanium film 109 improves burying performance into the hole when an aluminium alloy film is formed on the titanium film by spattering; the improvement is called aluminium reflow (for ref., see the description of H. Nishimura et al., Proc. VLSI Multilevel Interconnection Conf., p. 170. 1991.)

FIG. 7 shows the sectional view of the main processing steps of the method of manufacturing the semiconductor device. The semiconductor device according to the second embodiment differs from that of the first embodiment in the structure of the second wiring layer. For manufacturing steps, steps only after those steps that are the forming steps (from FIGS. 4A to 4H) of the nitrogen-containing metal film with high melting point, of which steps are same as those of the first embodiment. In the second embodiment, the titanium film 109 is formed by the spattering method to become the thickness to approximately 10 nm under the substrate temperature of 200° C. following the formation of a nitrogen-containing metal film, consisting of titanium nitride, with the high melting point 106. Following this step, an Al—Si—Cu film is formed by the spattering method under the substrate temperature of 350° C. to make the secondary wiring layer 108 finally resulted in the multilayer wiring structure illustrated in the FIG. 6.

A temperature on forming an Al—Si—Cu film of the secondary wiring layer of the second embodiment is higher than that of the first embodiment because of reflow of aluminium, in other words, burying Al alloy into a hole by giving fluidity. The use of titanium film 109 as an undercoat prevents that the interface energy between the Al alloy and the undercoat decreases and coagulation at film formation can be prevented. As a result of these facts of the second embodiment, FIG. 6 shows that the burying performance of Al—Si—Cu used for the secondary wiring layer 108 into the via hole is improved and the via resistance is lowered to provide a wiring structure with a high reliability in comparison with that of the first embodiment shown in the FIG. 3.

In the second embodiment, the formation of Al—Si—Cu film by spattering method including heating step at 350° C. is performed after forming the nitrogen-containing metal film 106 with high melting point. However, the effect of the nitrogen-containing metal film 106 with high melting point to prevent fluorine dispersion was same as that of the first embodiment showing that there is no dispersion of fluorine inside the Ti and Al—Si—Cu layers even after heating process. In addition, swelling or falling of a film was never observed.

In the first and second embodiments, metal materials to bury in a via hole and to use for the secondary wiring layer are constructed integrally. Different materials can be used for the via plug and the secondary wiring layer each. For example, it may be allowed that Al alloy is formed for the secondary wiring layer after W is buried as a via plug. In this case, the nitrogen-containing metal film with high melting point of the invention is yet effective to prevent fluorine dispersion.

In the first and the second embodiments, the use of silicon oxide for flattened insulation film 105. Silicon oxide can be naturally replaced by a silicon nitride film or a silicon oxynitride film.

Besides, in the example, the interlayer insulation film between the first wiring layer 103 and the second wiring layer 108 comprises the interlayer insulation film 104 with a low dielectric constant and the flattened insulation film 105. The interlayer insulation film can be also made with the interlayer insulation film 104 with a low dielectric constant only. In this case, an effect to result in unnecessary setting of the upper contact layer 143 on the basis of that TiN used as the nitrogen-containing metal film 106 with high melting point has good contact to the amorphous carbon fluoride film 142.

Furthermore, the normal insulation film, PSG, was used as the insulation film 102 in the embodiments. The insulation film 102 can be naturally composed of films including the interlayer insulation film 104 having an amorphous carbon fluoride film as the main component, with a low dielectric constant. In this case, the nitrogen-containing metal film with high melting point can be naturally used for the protection of the side wall of wiring metal buried in a contact hole, which connects the silicon substrate 101 and the first wiring layer 103.

Figure 8:
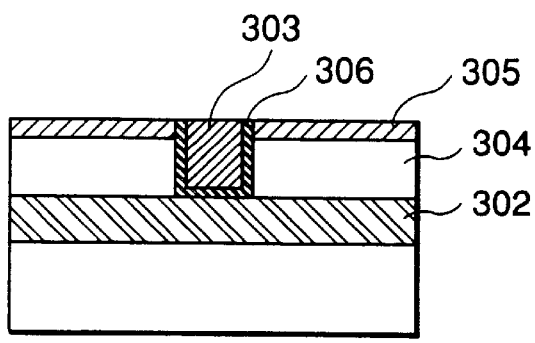
FIGS. 8, 9 and 10A–10E are directed to a third embodiment of the present invention
Figure 9:
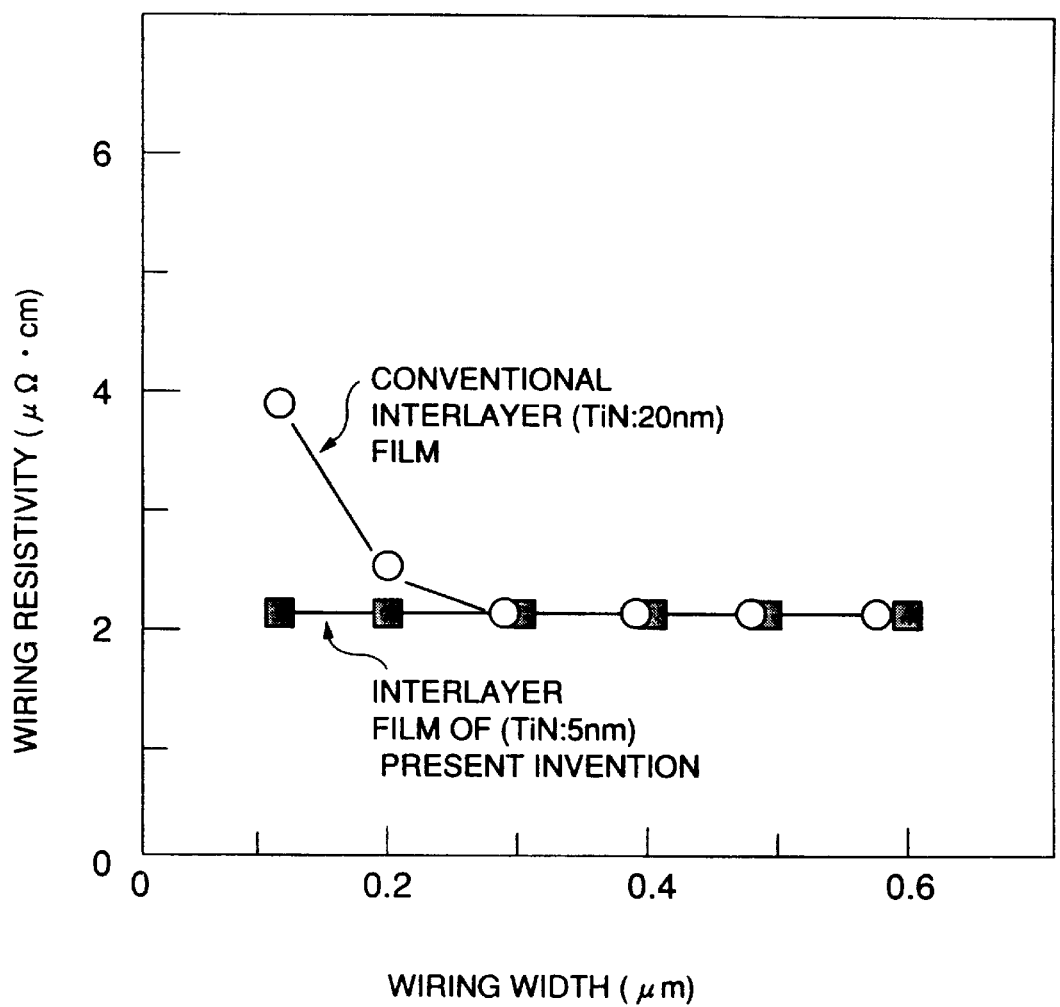

Now, referring to FIGS. 8 to 10, description proceeds to a third embodiment of the present invention.

A semiconductor device according to the third embodiment is characterized by using copper as the first wiring layer 303. Resistivity of copper is, at the most, equal to 1.8. The resistivity of copper is about 30% smaller than that of aluminum which is equal to 2.9. The use of copper as the first wiring layer 303 is therefore effective for reducing wiring resistance. It is generally known that a nitrogen-containing metal film with high melting point (such a film as numbered by 306 (TiN) in FIG. 8) is used as an insulation film containing silicon for preventing copper from being diffused (International Electron Device Meeting, page 769, 1997). In the third embodiment, the interlayer film has a structure in which a flattened insulation film 305 composed of a silicon oxide film is formed on an amorphous carbon fluoride film 304 and further a nitrogen-containing metal film with high melting point 306 (TiN) is formed between the interlayer film and the first wiring layer 303. With this structure, the nitrogen-containing metal film with high melting point 306 (TiN) is effective to prevent not only reaction between the amorphous carbon fluoride film 304 and a wiring metal such as the first wiring layer 303 but also diffusion of copper into the flattened insulation film 305. In the nitrogen-containing metal film with high melting point 306 (TiN), a thickness of 5 nm is required to prevent the reaction between the amorphous carbon fluoride film 304 and the wiring metal while a larger thickness of 10 nm is required to prevent the diffusion of copper into the flattened insulation film 305. The reason why the larger thickness of 10 nm is required is that the nitrogen-containing metal film with high melting point 306 (TiN) has lost effective thickness by reaction with a silicon oxide film. In films formed by a sputter method, or the like, thickness of metal becomes smallest in side walls around a bottom of a wiring layer. In the structure illustrated in FIG. 8, the amorphous carbon fluoride film 304 is exposed in the side walls around the bottom of the first wiring layer 303 where the nitrogen-containing metal film with high melting point 306 (TiN) has the smallest thickness thereof. On the other hand, copper is never diffused into the amorphous carbon fluoride film 304. Around the bottom of the first wiring layer 303, it is enough that the nitrogen-containing metal film with high melting point 306 (TiN) serves only to prevent diffusion of fluoride. It becomes possible that a thickness of only 5 nm is required in the nitrogen-containing metal film with high melting point 306 (TiN). As a result, resistance of a wiring layer of copper having a small wiring width of about 0.1 mm can be reduced, as depicted in FIG. 9.

Next, referring to FIGS. 10A to 10E, description is made as regards a method of manufacturing the semiconductor device according to the third embodiment of the present invention.

Figure 10A:
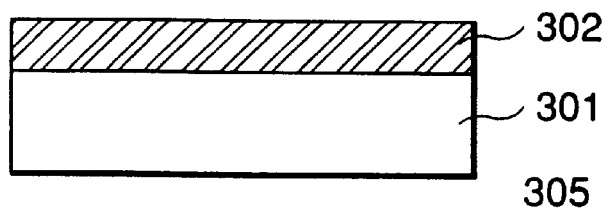
Figure 10B:
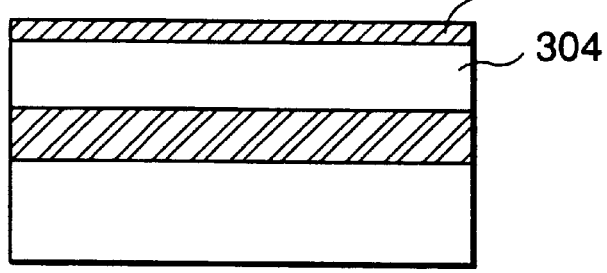
Figure 10C:
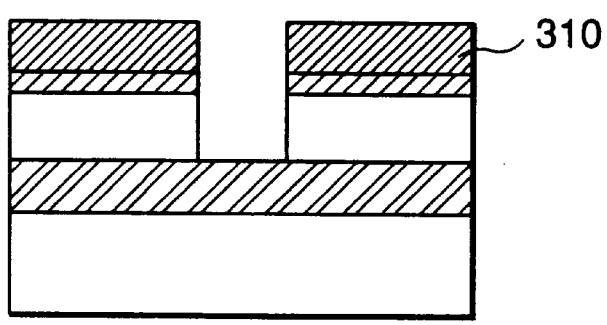
Figure 10D:
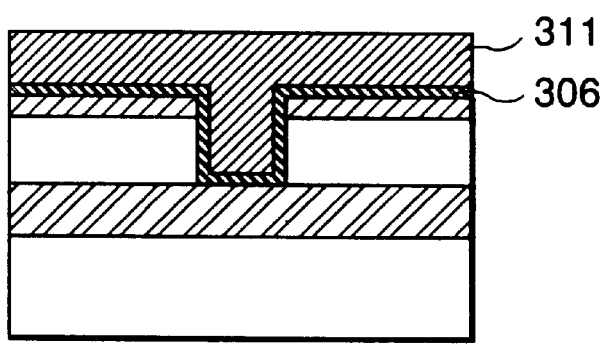
Figure 10E:
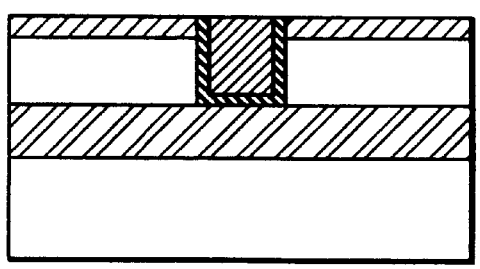

At first, a silicon substrate 301 is prepared in a known manner, as illustrated in FIG. 10A. The silicon substrate 301 has a principal surface directed upward of FIG. 10A. An insulation film 302 is formed on the principal surface of the silicon substrate 301, as shown in FIG. 10A. The amorphous carbon fluoride film 304 is then formed to have a thickness of approximately 60 nm. Thereafter, the flattened insulation film 305 composed of a silicon oxide film is formed to have a thickness of approximately 20 nm, as illustrated in FIG. 10B. Further, by lithography technique using photoresist, a resist mask 310 is formed by inverted pattern. A groove is formed, as illustrated in FIG. 10C, through an etching of the oxide film and an etching of the amorphous carbon fluoride film 304. The nitrogen-containing metal film with high melting point 306 (TiN) is then formed to have a thickness of approximately 20 nm, after the resist mask 310 is removed. A copper layer 311 is then formed to have a thickness of approximately 1 mm, as depicted in FIG. 10D. Thereafter, the copper layer 311 and the nitrogen-containing metal film with high melting point 306 (TiN) are etched back by the use of CMP to provide a semiconductor device having a structure illustrated in FIG. 10E.

As mentioned above, the amorphous carbon fluoride film is expected as an excellent interlayer insulation film having low dielectric constant. However, the heat resistant performance of the amorphous carbon fluoride film is low due to the high reactive nature of fluorine to a metal that are contained in the film and results in difficulty of application to commercial processes. It becomes possible that a nitrogen-containing metal film with high melting point sandwiched by a wiring metal or alloy and the amorphous carbon fluoride film prevents the dispersion and reaction of fluorine on heat processing, the decrease in fluorine content in an amorphous carbon fluoride film, and the formation of fluorides in a metal.

Particularly, a conductive nitrogen-containing metal film with high melting point is effective as a protecting film of a metal to bury in a contact hole and a via hole and a structure is yielded to protect a metal from the reaction to fluorine without complicated processes.

As a result, it becomes possible that the reaction of a metal and fluorine is prevented in a place, where an amorphous carbon fluoride film contacts a metal material, in the semiconductor device in which an amorphous carbon fluoride film is used as an insulation film by putting either the known silicon-containing insulation film or nitrogen-containing metal film that has a high melting point and is disclosed in the present invention on the surface of the place. This means that a silicon insulation film is put in a place, where is favorably an insulation film for a structure or a process, and a conductive nitrogen-containing metal film with high melting point is put in a place, where is favorably a conductive film in the amorphous carbon fluoride film-metal surface. By this means, structural freedom is greatly improved. Naturally, it is the item of design in which these films to prevent fluorine dispersion are not put on the interface of a metal relatively difficult to be corroded by fluorine or on the interface where there is a small effect to the element performance by the corrosion.

As mentioned before, the problems of the reaction of a metal and fluorine, the increase in resistance caused by the reaction, and falling of various films during processing steps now never occur by disposing a nitrogen-containing metal film with high melting point on the interface between a metal and an amorphous carbon fluoride film. In the semiconductor device in that an amorphous carbon fluoride film is used as an interlayer insulation film, the use of the structure of the invention has first made possible that a practical structure and manufacturing process have been built up, and the higher integration is realized by a low dielectric constant of the amorphous carbon fluoride film.

Another effect of a titanium nitride film for this purpose is to improve the contact performance of an amorphous carbon fluoride film.

The use of this amorphous carbon fluoride film as an undercoat of the upper wiring layer as shown in the embodiments shows the effect of preventing to expose the material, which contains carbon and fluorine being different materials during LSI processes, to the surface of a wafer. This means that there is no possibility of contaminating the current processing lines with carbon and fluorine when the wafer runs through the processing lines on the basis of the protecting effect of a nitrogen-containing metal film with high melting point against fluorine dispersion.

Finally, in these embodiments, the use of nitrogen-containing metal film with high melting point as a protector for a buried metal of via hole in the multilayer wiring structure with an interlayer insulation film consisting of amorphous carbon fluoride film has been described. In this example of the structure, however, the embodiment is to be considered in all respects as illustrative and not respective. In other words, the same effect to prevent fluorine dispersion is yielded by putting a nitrogen-containing metal film with high melting point upon the interface between an amorphous carbon fluoride film and a metal material in the structure of any semiconductor devices.

The effect to prevent fluorine dispersion of a nitrogen-containing metal film with high melting point in the invention may be also yielded in the case when fluorine-containing film consists of material other than the amorphous carbon fluoride. In applying other fluorine-containing materials to a semiconductor device, the disposition of nitrogen-containing metal film with high melting point on the interface between the material and the metal will improve heat resistant performance of fluorine-containing material and protect the metal material.

What is claimed is:

1. A method of manufacturing a semiconductor device, said method comprising the steps of:

forming an insulation film including at least an amorphous carbon fluoride film;

selectively etching said insulation film;

forming a conductive nitrogen-containing metal film with high melting point on said insulation film;

forming a film of wiring metal; and heating at least said conductive nitrogen-containing metal film with high melting point.

2. A method as claimed in claim 1, wherein said wiring metal comprises a metal selected from the group consisting of aluminium, titanium, tungsten, copper, and silicon.

3. A method as claimed in claim 1, wherein said wiring metal comprises an alloy containing at least one metal selected from the group consisting of aluminium, titanium, tungsten, copper, and silicon.

4. A method as claimed in claim 1, wherein said heating step is carried out under temperature between 200° C. and 400° C., both inclusive.

5. A method as claimed in claim 1, wherein said conductive nitrogen-containing metal film with high melting point is a nitrogen-containing titanium film.

6. A method as claimed in claim 1, wherein said nitrogen-containing titanium film has a composition ratio approximately 1:1 of titanium and nitrogen.

7. A method of manufacturing a semiconductor device, said method comprising the steps of:

forming an insulation film including at least partially an amorphous carbon fluoride film;

selectively etching said insulation film;

forming a conductive nitrogen-containing metal film with high melting point on said insulation film;

forming a film of titanium on said nitrogen-containing metal film with high melting point;

forming a film of wiring metal including aluminium; and heating at least said conductive nitrogen-containing metal film with high melting point.

8. A method as claimed in claim 7, wherein said heating step is carried out under temperature between 200° C. and 400° C., both inclusive.

* * * * *